United States Patent
Wuerstlein et al.

(10) Patent No.: US 9,543,674 B2
(45) Date of Patent: Jan. 10, 2017

(54) ELECTRONIC UNIT, IN PARTICULAR CAPACITIVE PROXIMITY SENSOR

(71) Applicant: Brose Fahrzeugteile GmbH & Co. Kommanditgesellschaft, Hallstadt, Hallstadt (DE)

(72) Inventors: Holger Wuerstlein, Zeil am Main (DE); Thomas Weingaertner, Memmelsdorf (DE); Christian Weidenbacher, Donnersdorf (DE); Holger Schmitt, Adelsdorf (DE); Thorsten Kuhnen, Litzendorf (DE)

(73) Assignee: Brose Fahrzeugteile GmbH & Co. Kommanditgesellschaft, Hallstadt, Hallstadt (DE)

( * ) Notice: Subject to any disclaimer, the term of this patent is extended or adjusted under 35 U.S.C. 154(b) by 0 days.

(21) Appl. No.: 14/820,717

(22) Filed: Aug. 7, 2015

(65) Prior Publication Data

US 2016/0043486 A1 Feb. 11, 2016

(30) Foreign Application Priority Data

Aug. 7, 2014 (DE) .................. 10 2014 011 703

(51) Int. Cl.
*H01R 3/00* (2006.01)
*H01R 12/70* (2011.01)
*H03K 17/955* (2006.01)

(52) U.S. Cl.
CPC ........ *H01R 12/7076* (2013.01); *H03K 17/955* (2013.01); *H03K 2217/96023* (2013.01)

(58) Field of Classification Search
CPC ..... H01R 12/79; H01R 12/62; H01R 13/6658; H05K 3/365; H05K 3/361

USPC .................. 439/493, 67, 425, 404, 405, 913
See application file for complete search history.

(56) References Cited

U.S. PATENT DOCUMENTS

| | | | | | |
|---|---|---|---|---|---|
| 2,694,182 | A | * | 11/1954 | Edlen | H01P 5/02 |
| | | | | | 174/71 C |
| 2,694,183 | A | * | 11/1954 | Edlen | H01P 1/225 |
| | | | | | 174/71 C |
| 3,087,051 | A | * | 4/1963 | Black | B60Q 1/32 |
| | | | | | 362/549 |
| 3,602,872 | A | * | 8/1971 | Braunstein | H02G 15/12 |
| | | | | | 174/71 C |
| 3,713,072 | A | | 1/1973 | Henschen et al. | |

(Continued)

FOREIGN PATENT DOCUMENTS

DE 2245982 4/1973
DE 4237870 A1 3/1994

(Continued)

*Primary Examiner* — Abdullah Riyami
*Assistant Examiner* — Vladimir Imas
(74) *Attorney, Agent, or Firm* — Laurence A. Greenberg; Werner H. Stemer; Ralph E. Locher

(57) ABSTRACT

An electronic unit has an electronic assembly that comprises a circuit board, and also having a conductor that is connected to said electronic assembly and is provided with a flat connection end. At least one piercing contact protrudes down from the circuit board and connects the conductor electrically to the electronic assembly. The piercing contact penetrates the connection end of the conductor while forming an electrical connection with a conductor track of the conductor. The electronic component is particularly suited as a capacitive proximity sensor for a vehicle.

6 Claims, 1 Drawing Sheet

(56) References Cited

U.S. PATENT DOCUMENTS

| | | | | |
|---|---|---|---|---|
| 3,918,787 A * | 11/1975 | Hays | H01R 11/281 | 439/416 |
| 4,517,625 A * | 5/1985 | Frink | H01R 12/85 | 361/755 |
| 4,655,517 A * | 4/1987 | Bryce | H01R 12/58 | 411/510 |
| 4,738,009 A * | 4/1988 | Down | H01R 9/0509 | 29/33 M |
| 4,746,307 A * | 5/1988 | Joly | H01R 25/161 | 439/394 |
| 4,813,883 A * | 3/1989 | Staley | H01R 4/2416 | 439/391 |
| 4,976,626 A * | 12/1990 | Dibble | H01R 9/096 | 439/67 |
| 5,964,768 A * | 10/1999 | Huebner | A61B 17/1686 | 411/115 |
| 6,042,430 A * | 3/2000 | Hollick | F16B 31/021 | 411/309 |
| 6,155,856 A * | 12/2000 | Sanada | H01R 9/091 | 439/246 |
| 6,196,863 B1 * | 3/2001 | Schwant | H01R 12/67 | 439/417 |
| 6,261,119 B1 * | 7/2001 | Green | H01R 4/2408 | 439/411 |
| 6,390,831 B2 * | 5/2002 | Shimada | H04Q 1/10 | 439/74 |
| 6,447,326 B1 * | 9/2002 | Teach | H01R 13/6658 | 439/460 |
| 6,638,082 B2 * | 10/2003 | Belopolsky | H01R 13/03 | 439/68 |
| 6,699,062 B1 * | 3/2004 | Barnett | H01R 4/2483 | 439/416 |
| 7,214,108 B2 * | 5/2007 | Barnett | F16B 31/021 | 439/797 |
| 7,243,422 B2 * | 7/2007 | Ikeda | H01R 43/205 | 29/33 M |
| 7,273,389 B2 * | 9/2007 | Hoppach | H01R 4/2404 | 439/275 |
| 7,507,100 B2 * | 3/2009 | Malkin | H01R 12/616 | 439/329 |
| 7,722,365 B2 * | 5/2010 | Honda | H01R 4/02 | 439/78 |
| 7,952,035 B2 * | 5/2011 | Falk | H01R 13/5216 | 174/650 |
| 8,075,349 B2 * | 12/2011 | Du | H01R 12/716 | 439/677 |
| 8,167,629 B2 * | 5/2012 | Ito | H01R 12/70 | 439/736 |
| 8,187,007 B2 * | 5/2012 | Emde | H01R 12/585 | 439/751 |
| 8,317,443 B2 * | 11/2012 | Stauch | F16B 31/021 | 411/2 |
| 8,613,625 B2 * | 12/2013 | Costa | H01R 4/2433 | 439/116 |
| 8,690,588 B2 * | 4/2014 | Jetton | B60R 16/0238 | 439/76.2 |
| 8,702,442 B2 * | 4/2014 | Debenedictis | H01R 4/2429 | 439/395 |
| 2011/0183529 A1 | 7/2011 | Heise et al. | | |
| 2013/0234828 A1 | 9/2013 | Holzberg et al. | | |
| 2015/0077940 A1 | 3/2015 | Rapisarda | | |

FOREIGN PATENT DOCUMENTS

| | | |
|---|---|---|
| DE | 19804586 A1 | 8/1998 |
| DE | 102004031434 A1 | 1/2006 |
| DE | 102009020984 A1 | 11/2009 |
| DE | 102010049400 A1 | 4/2012 |
| JP | 2000173686 A | 6/2000 |
| WO | 2014056539 A1 | 4/2014 |

* cited by examiner

ELECTRONIC UNIT, IN PARTICULAR CAPACITIVE PROXIMITY SENSOR

CROSS-REFERENCE TO RELATED APPLICATION

This application claims the priority, under 35 U.S.C. §119, of German patent application DE 10 2014 011 703.0, filed Aug. 7, 2014; the prior application is herewith incorporated by reference in its entirety.

BACKGROUND OF THE INVENTION

Field of the Invention

The invention relates to an electronic unit having an electronic assembly that comprises a circuit board and also having an electrical conductor that contacts the electronic assembly and is provided with a flat connection end. The electronic unit is in particular a capacitive proximity sensor for a (motor) vehicle, wherein the conductor is used as a sensor electrode of the capacitive proximity sensor.

Modern vehicles are frequently equipped with sensors that render it possible to adjust vehicle parts in a non-contact manner. By way of example, a vehicle user is able by means of a sensor of this type to contactlessly actuate (in other words open and/or close) a vehicle door, for example by means of a hand or foot movement. A non-contact rear-door switch of this type is described, by way of example, in commonly assigned patent application Pub. No. US 2013/0234828 A1 and its counterpart German published patent application DE 10 2010 049 400 A1.

Capacitive proximity sensors are frequently used as sensors for detecting an actuation command. A capacitive proximity sensor of this type typically comprises a sensor electrode or multiple sensor electrodes and also a control unit.

The control unit usually comprises an electronic assembly that is accommodated in a housing. The electronic assembly is generally formed by means of a circuit board on which are mounted a microcontroller and/or other electronic components.

Flat conductors are frequently used as sensor electrodes and the flat conductors comprise a flat strip-shaped conductor track with an insulation which encompasses the conductor track. Flat conductor electrodes of this type are generally connected to the control device by way of electric feed lines in the form of conventional wire or braided lines. The feed lines are mostly connected by way of plug connections or solder connections to the flat conductor electrode at one end and to the electronic unit at the other end.

Feed lines are frequently soldered at one end to the associated flat conductor electrode and at the other end to the electronic unit by means of a plug connector (ZIF plug) that is integrally formed as one with the housing of the control device.

SUMMARY OF THE INVENTION

It is accordingly an object of the invention to provide an electronic assembly unit which overcomes the above-mentioned and other disadvantages of the heretofore-known devices and methods of this general type and which renders it possible to provide an expedient and inexpensive contact between a flat connection end of an electric conductor and a circuit board, in particular for providing a contact between a flat conductor electrode of a capacitive proximity sensor and the associated control unit.

With the foregoing and other objects in view there is provided, in accordance with the invention, an electronic unit, comprising:
an electronic assembly including a circuit board;
an electrical conductor formed with a flat connection end and with a conductor track; and
at least one piercing contact projecting (down) from the circuit board and electrically connecting the conductor to the electronic assembly, the piercing contact penetrating the connection end and forming an electrical connection with the conductor track of the conductor.

In other words, the electronic unit according to the invention has an electronic assembly circuit board that comprises a circuit board. The unit further comprises an electric conductor that is provided with a flat connection end. The conductor that is to be contacted is preferably a flat conductor that comprises over its entire length a flat, strip-shaped conductor track. However, it is fundamentally possible within the scope of the invention for the conductor to comprise any type of conductor cross section remote from the connection end. It is only necessary for the conductor to have a flat cross section in the region of the connection end. In particular, the conductor can be formed in this sense for example by means of a coaxial cable (or a corresponding conductor that has a cylindrical periphery without a coaxial inner conductor) that is pressed flat in an end region so as to form the connection end.

In order to connect the conductor in an electrical manner to the electronic assembly, at least one piercing contact is attached to the circuit board and projects downwards from the circuit board. The piercing contact penetrates the connection end of the conductor whilst forming an electrical connection with a conductor track of the conductor. As mentioned above, the unit is in particular a capacitive proximity sensor for a (motor) vehicle. The conductor functions in this case as a sensor electrode of the capacitive proximity sensor. The electronic assembly forms the functional core of a control unit of the capacitive proximity sensor. The electronic assembly comprises in particular a microcontroller in which a control and evaluation program (firmware) is implemented so as to operate the capacitive proximity sensor.

The unit in accordance with the invention is characterized by virtue of the fact that both an electrical contact and also a mechanical connection is produced between the conductor and the circuit board by means of simply placing the connection end on the circuit board (or conversely). Further processes such as for example soldering processes are neither necessary nor are they provided for this purpose so that the unit can be produced in a particularly simple and rational manner. In particular, it is also possible in this manner to automate the assembly process of the unit in a particularly simple manner.

In one preferred embodiment, the unit further comprises an (electronic assembly) housing in which the electronic assembly is accommodated.

In terms of further simplifying the mounting procedure for the unit, a supporting contour is preferably formed as one in the housing and the connection end of the conductor when properly positioned lies against the supporting contour so that the connection end is arranged between the supporting contour and the circuit board. The piercing contact engages by means of the connection end through into the supporting contour so that the piercing contact forms a mechanical (non-positive-locking and/or positive-locking) connection with the supporting contour. The supporting contour is formed in particular by means of a housing dome that is formed from a housing wall and protrudes into the housing interior. The piercing contact in this embodiment of the invention advantageously not only provides a contact arrangement between the conductor and circuit board and mechanically fastens the conductor to the circuit board but simultaneously also fixes the circuit board in the housing.

The connection end of the conductor is clamped in this case in an expedient manner between the supporting contour and the lower face of the circuit board that faces the supporting contour. In particular, the supporting contour has a planar upper face and the flat connection end lies against the planar upper face. A simple but yet very effective strain relief on the conductor is produced by virtue of clamping the connection end between the conductor plate and the supporting contour.

However, it is also fundamentally feasible within the scope of the invention that the supporting contour (or at least a part thereof) is arranged on the conductor itself.

In order to produce the above described unit, the conductor is initially introduced with the flat connection end into the housing and placed on the supporting contour. Subsequently, the circuit board is inserted into the housing. The circuit board is pressed with its lower face on to the connection end so that the piercing contact penetrates the conductor. The piercing contact also penetrates into the supporting contour so that the circuit board is mechanically fixed to the supporting contour.

The piercing contact or each piercing contact is preferably provided with a tip or a cutting edge so that when inserting the circuit board the piercing contact automatically penetrates the conductor (in other words both the insulation layer(s) and also the conductor track of the conductor) in a similar manner to a cutting contact. Since the conductor consequently does not require to be especially prepared for the connection to the circuit board (for example part of the insulation is removed or pre-drilled openings are provided), this arrangement ensures a particularly effective production process of the electronic unit.

The tip or cutting edge of the piercing contact ensures in an advantageous manner also that the piercing contact can be pressed into the (full) material of the supporting contour. However, it is also feasible within the scope of the invention that an opening that corresponds to the piercing contact is provided in the supporting contour and in the assembled state the piercing contact is inserted into the opening whilst forming a non-positive-locking connection or a positive-locking connection.

The piercing contact or each piercing contact is provided in particular with at least one fastening means, in particular a barbed hook in order to prevent the circuit board from self-detaching from the supporting contour.

In a further development, the electronic unit comprises at least one connection pin for a signal or electric supply line that is separate from the conductor. The connection pin or each connection pin is arranged in the housing in such a manner that when inserting the circuit board into the housing—at the same time as the piercing contact making contact with the conductor—a contact section of the connection pin is also pressed into a corresponding contact opening in the circuit board. Consequently, by simply placing the circuit board (and thus in particular without a soldering process) the electronic assembly is connected both to the conductor and also to the signal or electric supply line.

It is preferred that the connection pin or each connection pin comprises a contact section that is embodied so as to produce a press contact connection with the corresponding contact opening in the circuit board. The contact section of the connection pin is embodied in particular as a type of a so-called "press-fit" contact.

A connection between a contact pin and a corresponding metalized contact opening of an allocated circuit board is described as a press contact connection ("press-fit" connection) where the contact pin is pressed into the—smaller dimensioned—contact opening in such a manner that the contact pin is deformed in a plastic manner in a flexible press-in section. The plastic deformation of the contact pin produces in this manner a planar contact between the contact pin and the contact opening. Generally, the—normally metal—contact pin is cold welded with the metalized contact opening as a result of high local contact pressure as it is pressed in.

In order to form a sealed arrangement, the housing is preferably subsequently encapsulated during the course of the process or producing the unit with the mounted circuit board and the conductor that is contacted as described above.

Other features which are considered as characteristic for the invention are set forth in the appended claims.

Although the invention is illustrated and described herein as embodied in a electronic unit, in particular a capacitive proximity sensor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

Parts that correspond to one another are identified with the same reference numeral throughout the figures.

DETAILED DESCRIPTION OF THE INVENTION

Figure 1:
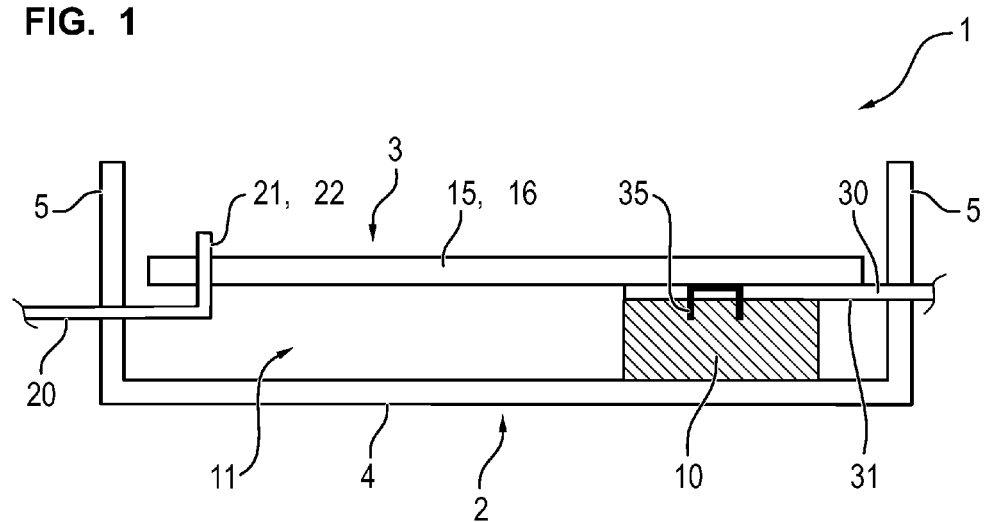
FIG. 1 illustrates a schematic cross sectional view of a section of a capacitive proximity sensor that has a control unit that comprises an (electronic assembly) housing and an electronic assembly that is received in the housing, and also has a flat conductor electrode that contacts a circuit board of the electronic assembly.

Referring now to the figures of the drawing in detail and first, particularly, to FIG. 1 thereof, there is shown a section of a capacitive proximity sensor 1 for a (motor) vehicle. The capacitive sensor is by way of example used for the contactless actuation of a vehicle door (for instance, to open the door or the hatchback).

The electronic unit 1 comprises an (electronic assembly) housing 2 that is manufactured in an injection molding method from a synthetic material. The housing 2 is in the form of a tub or bucket that is open towards an upper face 3 of the housing 2. The housing 2 is thus formed by a housing base 4 that is encompassed by side walls 5. In order to protect the components that are accommodated in the housing 2, the tub is filled with an encapsulation compound (not illustrated) so that the housing 2 together with the parts contained therein is sealed as a consequence in a gas-tight and liquid-tight manner.

A dome-shaped supporting contour 10 projects (upward) from the housing base 2 into a housing inner space 11 that is enclosed by the housing 2.

An electronic assembly 15 lies in the housing 2. The electronic assembly 15 is formed by a circuit board 16 that is populated with electronic components (not explicitly illustrated here), in particular a microcontroller.

Furthermore, multiple connection pins 20 are fixed in the housing 2. Only one such connection pin is visible in the illustration. The connection pins 20 are used to connect a signal or electric supply line to the circuit board 16 and consequently to electrically connect the electronic assembly 15 to at least one external control unit of the vehicle. Each connection pin 20 terminates at one end in a bush (not illustrated) that is integrally formed as one on the outer face of the housing 2 and is used to connect the signal and/or supply line. At the other end, each connection pin 20 terminates in the housing inner space 11 with a section that protrudes towards the upper face 3. In this section, the connection pin 20 is embodied as a press-fit contact 21 that lies in a corresponding contact opening 22 in the circuit board 16 while forming an electrical connection.

A flat conductor electrode 30 is connected to the electronic assembly 15 on the side lying opposite the connection pin 20. A connection end 31 of the flat conductor electrode 30 is arranged in the housing inner space 11, whereas the other flat conductor electrode 30 is guided through a through-opening out of the housing 2. The flat conductor electrode 30 is used as a sensor electrode of the capacitive proximity sensor 1.

The connection end 31 lies on the supporting contour 10, whereas the circuit board 16 lies in turn on the connection end 31. The flat conductor electrode 30 is consequently clamped in the region of its connection end 31 in a sandwich-like manner between the circuit board 16 and the supporting contour 10. An electrical connection is produced between the flat conductor electrode 30 and the circuit board 16 in that a contact element 35 that protrudes from the circuit board 16 penetrates the flat conductor electrode 30.

Figure 2:
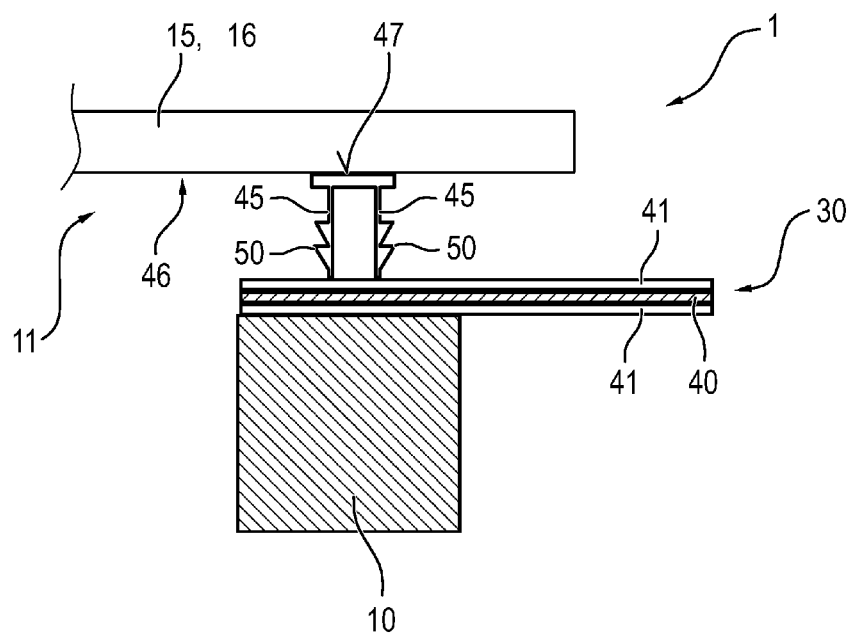
FIG. 2 illustrates the proximity sensor in accordance with FIG. 1 in a pre-assembled state prior to the insertion of the circuit board into the housing.

FIG. 2 illustrates in an enlarged view the supporting contour 10, the connection end 31 of the flat conductor electrode 30 and the circuit board 16 that is provided with the contact element 35 in a pre-assembled state in which the connection end 31 is already placed on the supporting structure 10 but the circuit board 16 is not yet inserted into the housing 2, so that also the electrical connection between the flat conductor electrode 30 and the electronic assembly 15 has not yet been produced. It is evident from FIG. 2 that the flat conductor electrode 30 comprises a copper foil 40 that acts as a conductor track and is coated on all faces, in particular on the two flat faces, with an insulating layer 41 manufactured from a synthetic material.

The contact element 35 that is preferably manufactured from a galvanized copper alloy, brass or bronze comprises two piercing contacts 45 that protrude on a lower face 46 of the circuit board 16. The lower face 46 faces the flat conductor electrode 30. The pin-like piercing contacts 45 are connected in an electrical manner to the circuit board 16 by way of a contact surface 47 that is arranged on the lower face 46. Each piercing contact 45 is provided in the region of its respective free end that is remote from the circuit board 16 with a tip and multiple barbed hooks 50. The piercing contacts 45 are arranged on the circuit board 16 in such a manner that when the circuit board 16 is arranged in the housing 2 in the proper manner said piercing contacts are aligned with the supporting contour 10.

In order to produce the unit 1 illustrated in FIG. 1, the circuit board 16 is populated—preferably using an SMT process (SMT=Surface Mounted Technology)—with the microcontroller and the possibly provided further electronic components of the electronic assembly 15 that is to be constructed. The circuit board 16 is also populated in this process with the contact element 35.

The flat conductor electrode 30 is placed in the proper manner in the housing 2 so that the connection end 31 lies flat against the supporting contour 10.

Subsequently, the populated circuit board 16 is pressed into the housing 2. The magnitude of force used to press in said circuit board is controlled. As the circuit board 16 is inserted, the press-fit contacts 21 are pressed into the respective corresponding contact openings 22 in the circuit board 10. Contact is made simultaneously with the flat conductor electrode 30 in that the piercing contacts 45 are pushed through the flat conductor electrode 30 (and consequently also through the copper foil 40).

In so doing, the piercing contacts 45 also penetrate the body of the supporting contour 10 so that the circuit board 16 and the flat conductor electrode 30 are fixed in a mechanical manner to the supporting contour 10. The barbed hooks 50 support the connection so that the circuit board 10 is secured to prevent becoming detached from the supporting contour 10.

As an option, openings can be formed in advance in the supporting contour 10, said openings being aligned with the piercing contacts 45. The dimensions of the openings that have been provided in advance where appropriate are tailored to suit the piercing contacts 45 in such a manner that the piercing contacts are in turn fixed in said openings by means of a non-positive-locking and/or positive-locking arrangement. The piercing contacts 45 can be embodied in this case—as opposed to the illustration in accordance with FIG. 2—by way of example in the form of a press-fit contact.

As an option, positioning means are provided in the housing 2 and the flat conductor electrode 30 is positioned with respect to the circuit board 16 with the aid of the positioning means. By way of example, alignment pins protrude from the supporting contour 10 or the housing base 4 and both the flat conductor electrode 30 and also the circuit board 16 are placed with corresponding holes onto said alignment pins.

In addition, a second contact element 35 can be provided on the circuit board 16 in accordance with the description above and contact between the copper foil 40 and the circuit board 16 is likewise provided by means of said second contact element.

The contact arrangement with the flat conductor electrode 30, said contact being made redundant as a result of the second contact element 35 is used in particular for diagnostic purposes in that the electrical through-flow of the current path that is formed by way of the two contact elements 35 and the copper foil 40 is tested by means of the electronic assembly 15. It is thus possible by means of the electronic assembly 15 to diagnose whether the flat conductor electrode 30 is correctly connected to the electronic assembly 15.

It will be understood that the invention is not limited to the above-described exemplary embodiments. On the contrary, further embodiments of the invention can be derived by the person skilled in the art from the above description.

In particular, the described individual features of the invention and their design variants can also be combined with the one another in any manner.

The invention claimed is:

1. An electronic unit, comprising:
   an electronic assembly including a circuit board;
   an electrical conductor formed with a flat connection end and with a conductor track;
   a housing configured for receiving said electronic assembly;
   a supporting contour formed in said housing and supporting said connection end of said conductor lying flat against said supporting contour, with said connection end being arranged between said supporting contour and said circuit board; and
   at least one piercing contact projecting from said circuit board and electrically connecting said conductor to said electronic assembly, said piercing contact penetrating said connection end and forming an electrical connection with said conductor track of said conductor, and said piercing contact engaging through said connection end into said supporting contour while forming a mechanical connection with said supporting contour.

2. The electronic unit according to claim 1, embodied in a capacitive proximity sensor for a vehicle.

3. The electronic unit according to claim 1, wherein said piercing contact is provided with at least one fastener for securing said piercing contact to, and preventing said piercing contact from becoming detached from, said supporting contour.

4. The electronic unit according to claim 3, wherein said at least one fastener is a barbed hook.

5. The electronic unit according to claim 1, comprising at least one connection pin for connecting an allocated signal or electric supply line to said electronic assembly, said at least one connection pin being fixed in said housing such that, during insertion of said circuit board into said housing, a contact section of said connection pin is pushed into a corresponding contact opening formed in said circuit board.

6. The electronic unit according to claim 5, wherein said contact section of said connection pin is configured to produce a press contact connection with the corresponding said contact opening in said circuit board.

* * * * *